(12) United States Patent
Sasagawa et al.

(10) Patent No.: US 7,679,812 B2
(45) Date of Patent: Mar. 16, 2010

(54) SUPPORT STRUCTURE FOR MEMS DEVICE AND METHODS THEREFOR

(75) Inventors: Teruo Sasagawa, Los Gatos, CA (US); Clarence Chui, San Mateo, CA (US); Manish Kothari, Cupertino, CA (US); SuryaPrakash Ganti, Los Altos, CA (US); Jeffrey B. Sampsell, San Jose, CA (US); Chun-Ming Wang, Fremont, CA (US)

(73) Assignee: Qualcomm Mems Technologies Inc., San Diego, CA (US)

( * ) Notice: Subject to any disclaimer, the term of this patent is extended or adjusted under 35 U.S.C. 154(b) by 192 days.

(21) Appl. No.: 11/491,389

(22) Filed: Jul. 21, 2006

(65) Prior Publication Data

US 2007/0019923 A1    Jan. 25, 2007

Related U.S. Application Data

(60) Provisional application No. 60/702,080, filed on Jul. 22, 2005.

(51) Int. Cl.
*G02B 26/00* (2006.01)
*G02B 26/08* (2006.01)

(52) U.S. Cl. ............... 359/291; 359/223.1; 359/237

(58) Field of Classification Search ......... 359/290–292, 359/295, 223–225, 245, 260–263, 298, 198, 359/301–303, 317–318, 237, 242
See application file for complete search history.

(56) References Cited

U.S. PATENT DOCUMENTS

| | | | |
|---|---|---|---|
| 4,566,935 A | 1/1986 | Hornbeck | |
| 4,710,732 A | 12/1987 | Hornbeck | |
| 4,859,060 A | 8/1989 | Kitagiri et al. | |
| 4,956,619 A | 9/1990 | Hornbeck | |
| 5,233,456 A | 8/1993 | Nelson | |
| 5,287,215 A | 2/1994 | Warde et al. | |
| 5,454,906 A | 10/1995 | Baker et al. | |
| 5,485,304 A | 1/1996 | Kaeriyama | |
| 5,497,262 A | 3/1996 | Kaeriyama | |
| 5,526,172 A | 6/1996 | Kanack | |
| 5,526,951 A | 6/1996 | Bailey et al. | |
| 5,600,383 A | 2/1997 | Hornbeck | |

(Continued)

FOREIGN PATENT DOCUMENTS

CN    092109265    4/2003

(Continued)

OTHER PUBLICATIONS

ISR and WO for PCT/US2006/028276 filed Jul. 19, 2006.

(Continued)

*Primary Examiner*—Scott J Sugarman
*Assistant Examiner*—Dawayne A Pinkney
(74) *Attorney, Agent, or Firm*—Knobbe, Martens, Olson & Bear LLP

(57) ABSTRACT

A microelectromechanical systems device having support structures formed of sacrificial material surrounded by a protective material. The microelectromechanical systems device includes a substrate having an electrode formed thereon. Another electrode is separated from the first electrode by a cavity and forms a movable layer, which is supported by support structures formed of a sacrificial material.

41 Claims, 14 Drawing Sheets

U.S. PATENT DOCUMENTS

| | | | |
|---|---|---|---|
| 5,606,441 A | 2/1997 | Florence et al. | |
| 5,631,782 A * | 5/1997 | Smith et al. | 359/871 |
| 5,646,768 A | 7/1997 | Kaeiyama | |
| 5,650,881 A | 7/1997 | Hornbeck | |
| 5,673,139 A | 9/1997 | Johnson | |
| 5,745,281 A | 4/1998 | Yi et al. | |
| 5,751,469 A | 5/1998 | Arney et al. | |
| 5,783,864 A | 7/1998 | Dawson et al. | |
| 5,784,212 A | 7/1998 | Hornbeck | |
| 5,808,781 A | 9/1998 | Arney et al. | |
| 5,825,528 A | 10/1998 | Goossen | |
| 5,838,484 A | 11/1998 | Goossen et al. | |
| 5,867,302 A | 2/1999 | Fleming et al. | |
| 5,914,803 A | 6/1999 | Hwang et al. | |
| 5,920,421 A | 7/1999 | Choi | |
| 5,998,293 A | 12/1999 | Dawson et al. | |
| 6,038,056 A | 3/2000 | Florence et al. | |
| 6,040,937 A | 3/2000 | Miles | |
| 6,100,477 A | 8/2000 | Randall et al. | |
| 6,284,560 B1 | 9/2001 | Jech et al. | |
| 6,358,021 B1 | 3/2002 | Cabuz | |
| 6,447,126 B1 | 9/2002 | Hornbeck | |
| 6,465,355 B1 | 10/2002 | Horsley | |
| 6,574,033 B1 | 6/2003 | Chui et al. | |
| 6,602,791 B2 | 8/2003 | Ouellet et al. | |
| 6,618,187 B2 | 9/2003 | Pilossof | |
| 6,632,698 B2 | 10/2003 | Ives | |
| 6,650,455 B2 | 11/2003 | Miles | |
| 6,657,832 B2 | 12/2003 | Williams et al. | |
| 6,674,562 B1 | 1/2004 | Miles | |
| 6,677,225 B1 | 1/2004 | Ellis et al. | |
| 6,680,792 B2 | 1/2004 | Miles | |
| 6,713,235 B1 | 3/2004 | Ide et al. | |
| 6,778,306 B2 | 8/2004 | Sniegowski et al. | |
| 6,788,175 B1 | 9/2004 | Prophet et al. | |
| 6,794,119 B2 | 9/2004 | Miles | |
| 6,867,896 B2 | 3/2005 | Miles | |
| 6,882,458 B2 | 4/2005 | Lin et al. | |
| 6,967,757 B1 | 11/2005 | Allen et al. | |
| 6,987,432 B2 | 1/2006 | Lutz et al. | |
| 6,991,995 B2 | 1/2006 | Aulnette et al. | |
| 6,995,890 B2 | 2/2006 | Lin | |
| 7,078,293 B2 | 7/2006 | Lin et al. | |
| 7,119,945 B2 | 10/2006 | Cummings et al. | |
| 7,123,216 B1 | 10/2006 | Miles | |
| 7,198,973 B2 | 4/2007 | Lin et al. | |
| 7,250,315 B2 | 7/2007 | Miles | |
| 2001/0040675 A1 | 11/2001 | True et al. | |
| 2002/0027636 A1 | 3/2002 | Yamada | |
| 2002/0031155 A1 | 3/2002 | Tayebati et al. | |
| 2002/0054422 A1 | 5/2002 | Carr et al. | |
| 2002/0058422 A1 | 5/2002 | Jang et al. | |
| 2002/0071169 A1 | 6/2002 | Bowers et al. | |
| 2002/0110948 A1 | 8/2002 | Huang et al. | |
| 2002/0126364 A1 * | 9/2002 | Miles | 359/247 |
| 2002/0131682 A1 | 9/2002 | Nasiri et al. | |
| 2002/0146200 A1 | 10/2002 | Kudric et al. | |
| 2002/0186483 A1 | 12/2002 | Hagelin et al. | |
| 2003/0016428 A1 | 1/2003 | Kato et al. | |
| 2003/0036215 A1 | 2/2003 | Reid | |
| 2003/0053078 A1 | 3/2003 | Missey et al. | |
| 2003/0053233 A1 | 3/2003 | Felton | |
| 2003/0091072 A1 | 5/2003 | Wang et al. | |
| 2003/0123126 A1 | 7/2003 | Meyer et al. | |
| 2003/0132822 A1 | 7/2003 | Ko et al. | |
| 2003/0210851 A1 | 11/2003 | Fu et al. | |
| 2003/0231373 A1 | 12/2003 | Kowarz et al. | |
| 2004/0027671 A1 | 2/2004 | Wu et al. | |
| 2004/0035821 A1 | 2/2004 | Doan et al. | |
| 2004/0051929 A1 | 3/2004 | Sampsell et al. | |
| 2004/0080035 A1 | 4/2004 | Delapierre | |
| 2004/0100677 A1 | 5/2004 | Huibers | |
| 2004/0100680 A1 | 5/2004 | Huibers et al. | |
| 2004/0125347 A1 | 7/2004 | Patel et al. | |
| 2004/0136045 A1 | 7/2004 | Tran | |
| 2004/0145811 A1 | 7/2004 | Lin et al. | |
| 2004/0191946 A1 | 9/2004 | Patel et al. | |
| 2004/0207898 A1 | 10/2004 | Lin et al. | |
| 2004/0209195 A1 | 10/2004 | Lin | |
| 2004/0233498 A1 | 11/2004 | Starkweather et al. | |
| 2005/0024557 A1 | 2/2005 | Lin | |
| 2005/0036095 A1 | 2/2005 | Yeh et al. | |
| 2005/0195464 A1 | 9/2005 | Faase et al. | |
| 2006/0006138 A1 | 1/2006 | Lin | |
| 2006/0024620 A1 | 2/2006 | Nikkel et al. | |
| 2006/0024880 A1 | 2/2006 | Chui et al. | |
| 2006/0066935 A1 | 3/2006 | Cummings et al. | |
| 2006/0066936 A1 | 3/2006 | Chui et al. | |
| 2006/0076311 A1 | 4/2006 | Tung et al. | |
| 2006/0077502 A1 | 4/2006 | Tung et al. | |
| 2006/0077509 A1 | 4/2006 | Tung et al. | |
| 2006/0079048 A1 | 4/2006 | Sampsell et al. | |
| 2006/0256420 A1 | 11/2006 | Miles et al. | |
| 2007/0269748 A1 | 11/2007 | Miles | |
| 2008/0041817 A1 | 2/2008 | Lin | |
| 2008/0055699 A1 | 3/2008 | Lin | |
| 2008/0068699 A1 | 3/2008 | Miles | |

FOREIGN PATENT DOCUMENTS

| | | |
|---|---|---|
| DE | 198 47 455 | 4/2004 |
| EP | 0 069 226 | 1/1983 |
| EP | 0 695 959 | 2/1996 |
| EP | 0 788 005 | 8/1997 |
| EP | 1 275 997 | 1/2003 |
| JP | 9-127439 | 5/1997 |
| JP | 11-097799 | 4/1999 |
| JP | 2001-085519 | 3/2001 |
| JP | 2002-062490 | 2/2002 |
| JP | 2002-207182 | 7/2002 |
| JP | 2004-212656 | 7/2004 |
| WO | WO 02/079853 | 10/2002 |
| WO | WO 03/014789 | 2/2003 |
| WO | WO 2004/015741 | 2/2004 |
| WO | WO 2004/055885 | 7/2004 |
| WO | WO 2004-079056 A2 | 9/2004 |

OTHER PUBLICATIONS

Fan et al., "Channel Drop Filters in Photonic Crystals," Optics Express, vol. 3, No. 1 (1998).

Raley et al., "A Fabry-Perot Microinterferometer for Visible Wavelengths," IEEE Solid-State Sensor and Actuator Workshop, Hilton Head, SC, pp. 170-173 (1992).

M.Miles, *10.1 Digital Paper for Reflective Displays*, SID 02 Digest; pp. 115-117; Iridigm Display Corporation, San Francisco, CA.

Dai et al., "A CMOS surface micromachined pressure sensor," Journal of the Chinese institute of Engineers, 1999, vol. 22, No. 3 (May), pp. 375-380.

Wang et al., Flexible curcuit-based RF MEMS Switches, Proceedings of 2001 ASME International Mechanical Engineering Congress and Exposition, pp. 1-6, 2001.

IPRP for PCT/US2006/028276 filed Jul. 19, 2006.

Official Communication dated Oct. 21, 2009 in European App. No. 06788039.3.

* cited by examiner

SUPPORT STRUCTURE FOR MEMS DEVICE AND METHODS THEREFOR

CROSS REFERENCE TO RELATED APPLICATIONS

This application claims the benefit of U.S. Provisional Application No. 60/702,080, filed Jul. 22, 2005.

BACKGROUND

1. Field

The field of the invention relates to microelectromechanical systems (MEMS). More specifically, the field of the invention relates to interferometric modulators and methods of fabricating such interferometric modulators having supports for moving layers.

2. Description of the Related Technology

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An embodiment provides a microelectromechanical systems device including a substrate having a first electrode layer formed thereon, a second electrode, and at least one support structure. The second electrode is spaced apart from the first electrode layer by a cavity. The at least one support structure has side surfaces surrounded by a protective material preventing exposure of the side surfaces to the cavity. The at least one support structure is configured to support the second electrode layer.

According to another embodiment, a method is provided for making a interferometric modulator device. A substrate is provided. The substrate has a first electrode layer formed over the substrate. At least one support structure is surrounded with a protective material. A cavity is created between the first electrode layer and a movable layer after surrounding the at least one support structure.

According to yet another embodiment, an unreleased interferometric modulator device is provided. The unreleased interferometric modulator device includes a substrate having a first electrode layer formed thereon, a sacrificial layer overlying the first electrode layer, and a movable layer. The sacrificial layer includes at least one support structure surrounded by a protective mateiral over an entire side wall surface of the support structure. A movable layer is positioned over the sacrificial layer.

In accordance with another embodiment, a method is provided for making a microelectromechanical systems device. A substrate is provided. A first electrode layer is formed on the substrate. A sacrificial layer is deposited over the first electrode layer. At least one annular hole is formed in the sacrificial layer and then filled. A second electrode layer is deposited over the sacrificial layer after filling the annular hole. The sacrificial layer outside annular hole is removed after depositing the second electrode layer.

BRIEF DESCRIPTION OF THE DRAWINGS

These and other aspects of the invention will be readily apparent from the following description and from the appended drawings (not to scale), which are meant to illustrate and not to limit the invention, and wherein.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

According to preferred embodiments, an interferometric modulator display is provided with support structures (e.g., posts) formed of a sacrificial material. The support structures are formed in the same layer of material that serves as a sacrificial layer that is selectively etched to form the optical cavity of the interferometric modulator. An annular opening is opened in a planar sacrificial layer and filled with a protective material. The protective material, and optionally an overlying mechanical layer, prevent removal of the surrounded sacrificial material during the "release" etch of the sacrificial material. The protected sacrificial material then serves as a support for the mechanical or movable layer, and the surrounding protective material can remain in place or be subsequently removed.

Figure 1:
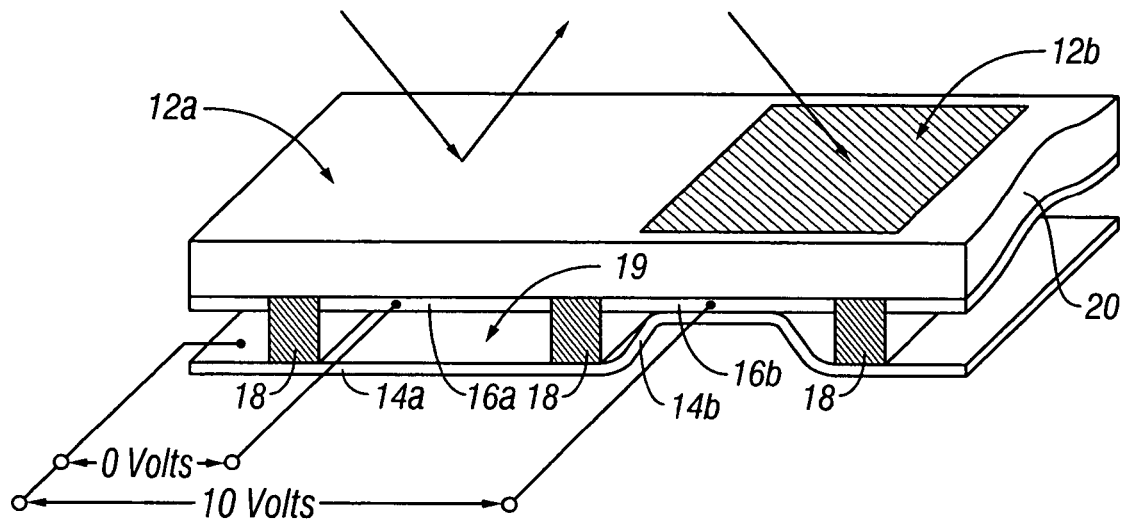
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
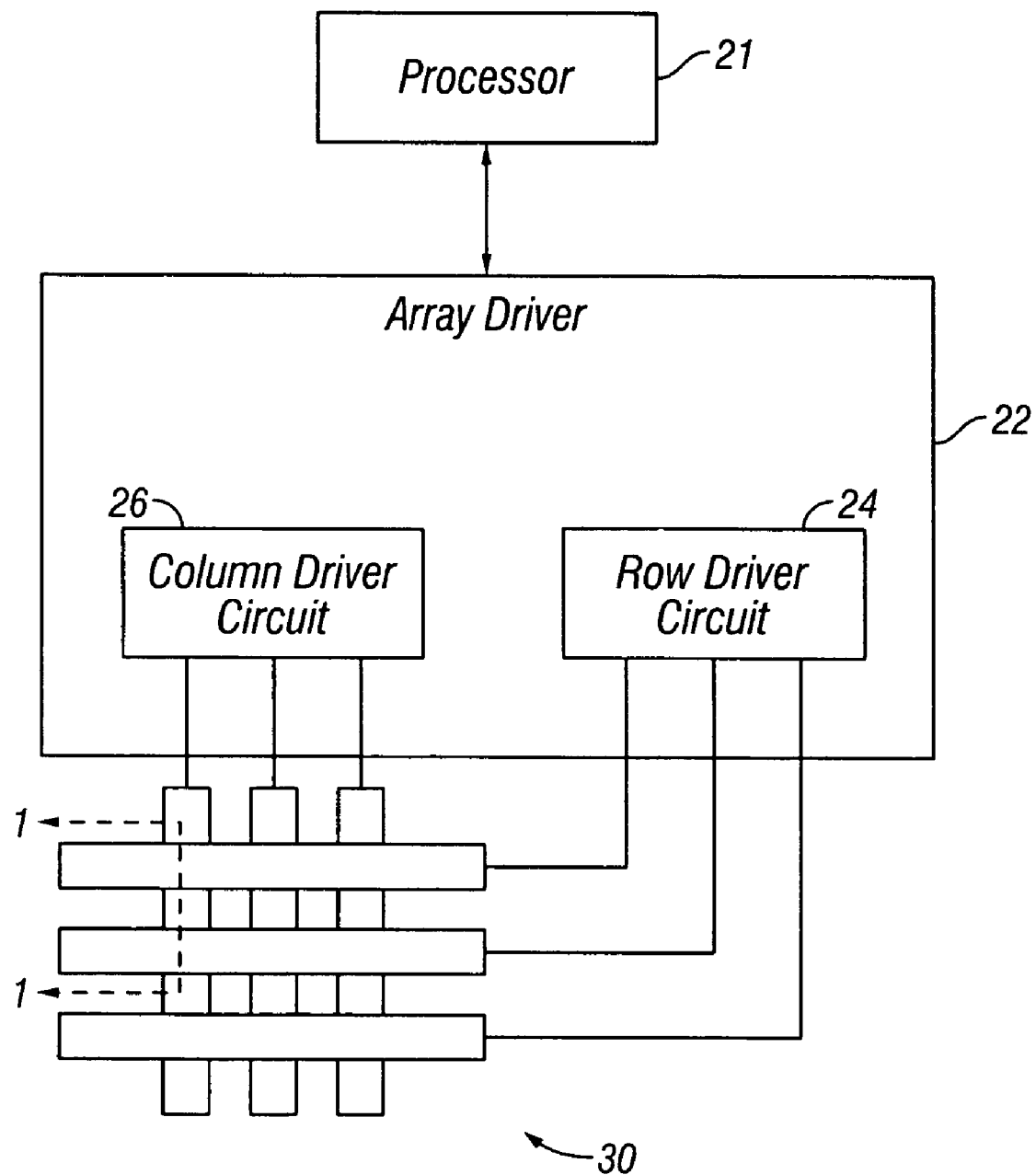
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC.®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
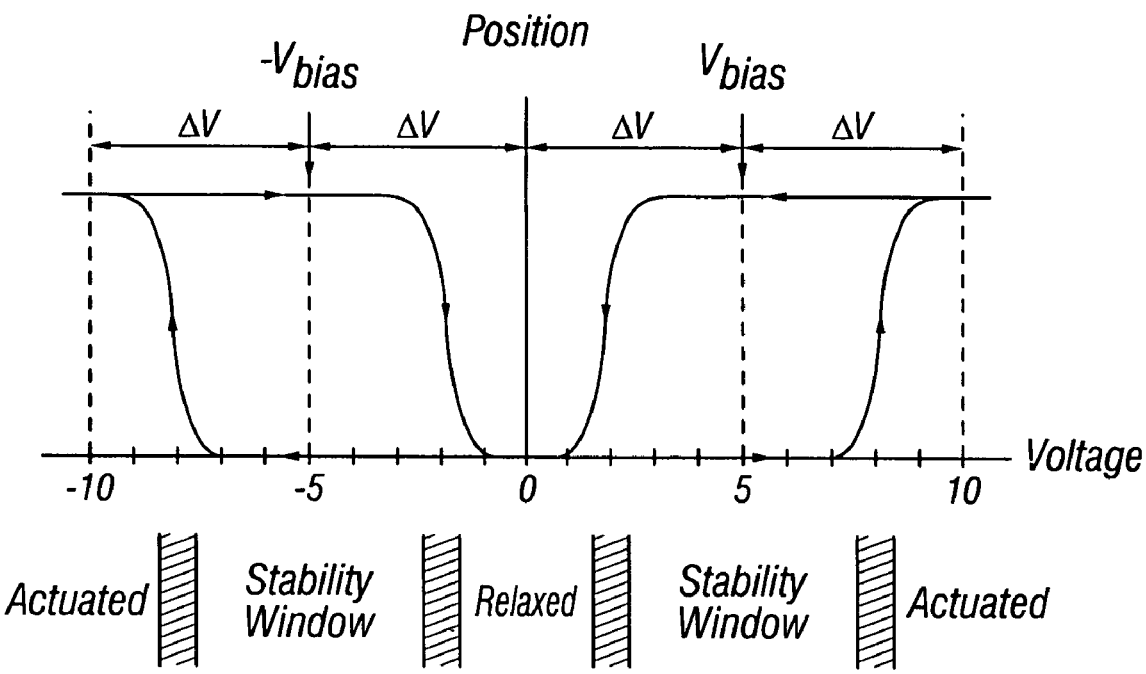
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
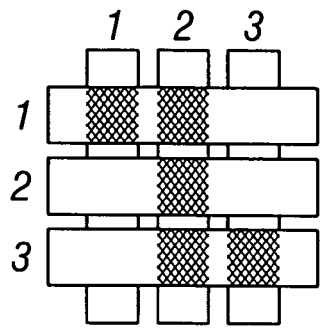
FIG. 5A illustrates one exemplary frame of display data in the 3×3 interferometric modulator display of FIG. 2.
Figure 5B:
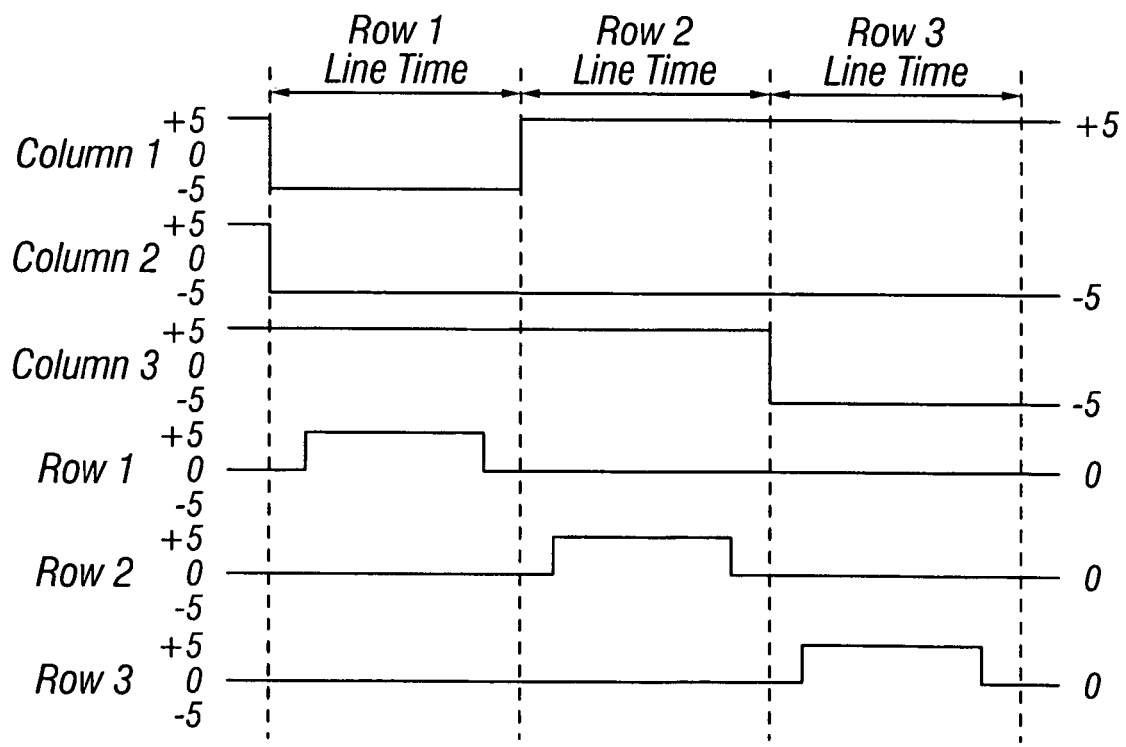
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
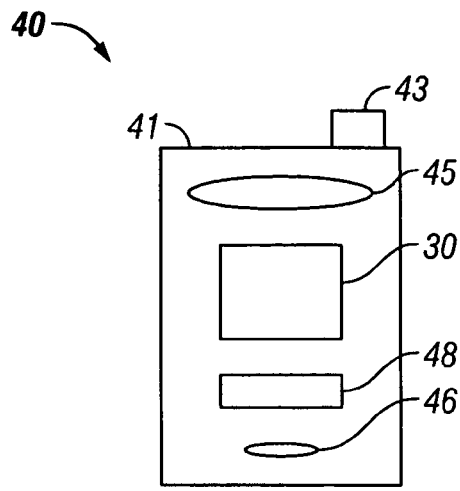
FIGS. 6A and 6B are system block diagrams illustrating an embodiment of a visual display device comprising a plurality of interferometric modulators.
Figure 6B:
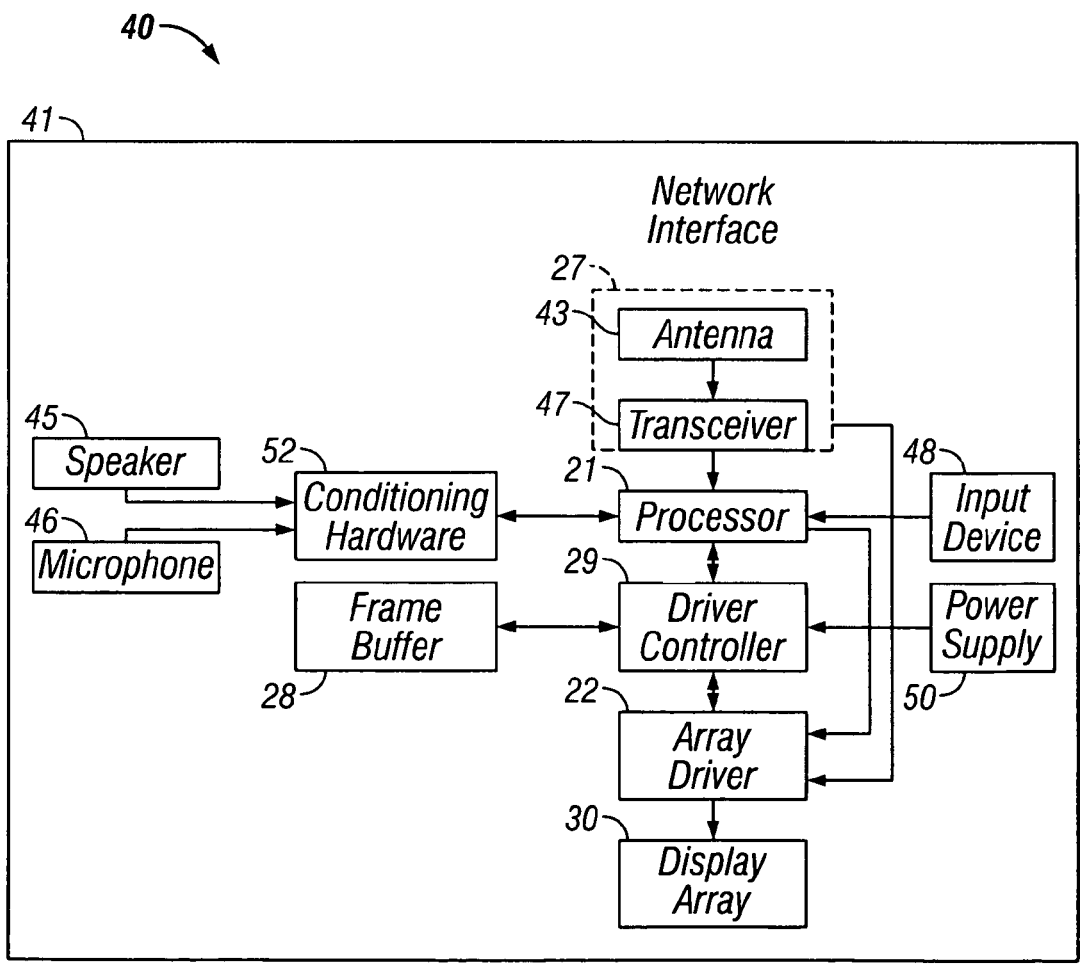

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the EEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The rocessor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
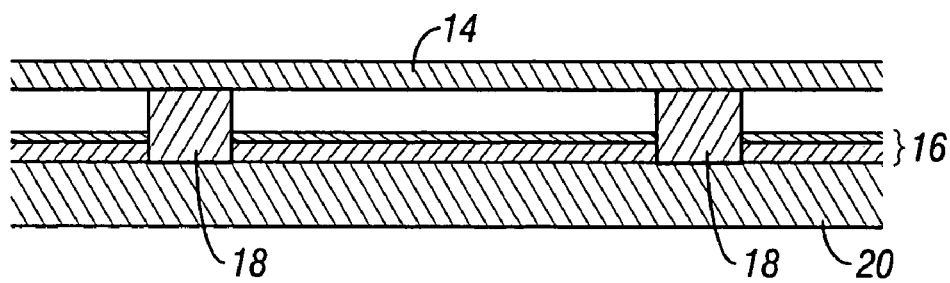
FIG. 7A is a cross section of the device of FIG. 1.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. The supports 18 can comprise isolated posts or continuous walls. For example, the supports 18 can include linear rails that support crossing strips of mechanical or movable material, and/or isolated posts. In one example, rails provide primarily support and posts within each cavity serve to stiffen the mechanical layer.

Figure 7B:
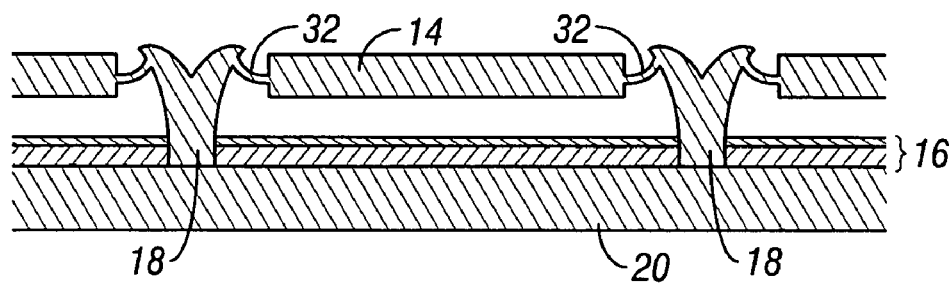
FIG. 7B is a cross section of an alternative embodiment of an interferometric modulator.
Figure 7C:
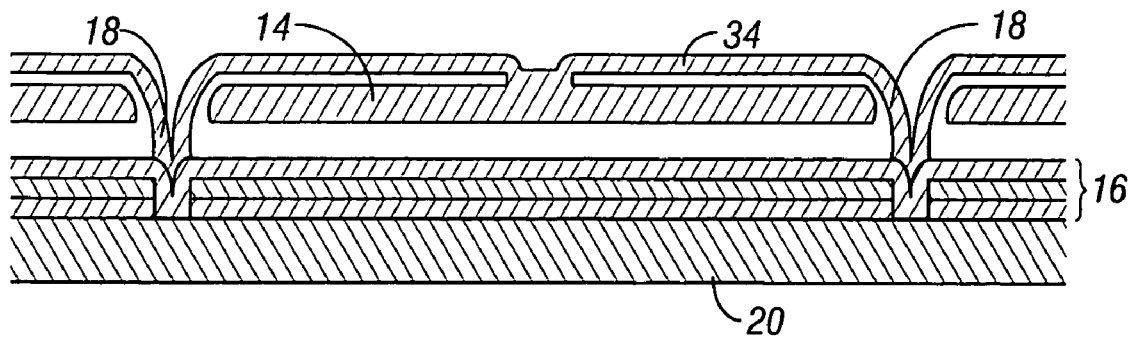
FIG. 7C is a cross section of another alternative embodiment of an interferometric modulator.
Figure 7D:
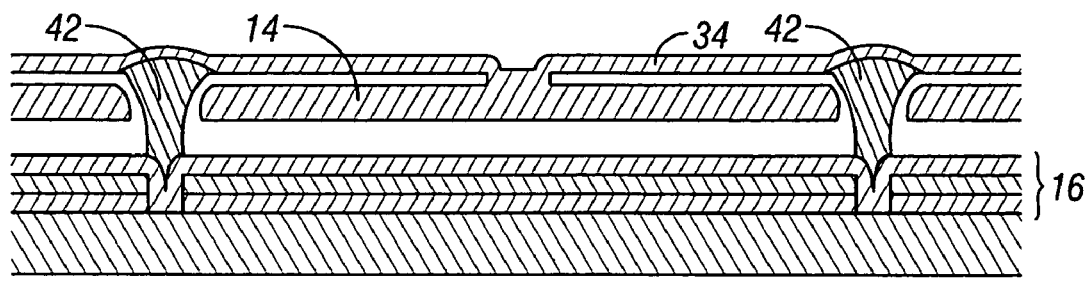
FIG. 7D is a cross section of yet another alternative embodiment of an interferometric modulator.
Figure 7E:
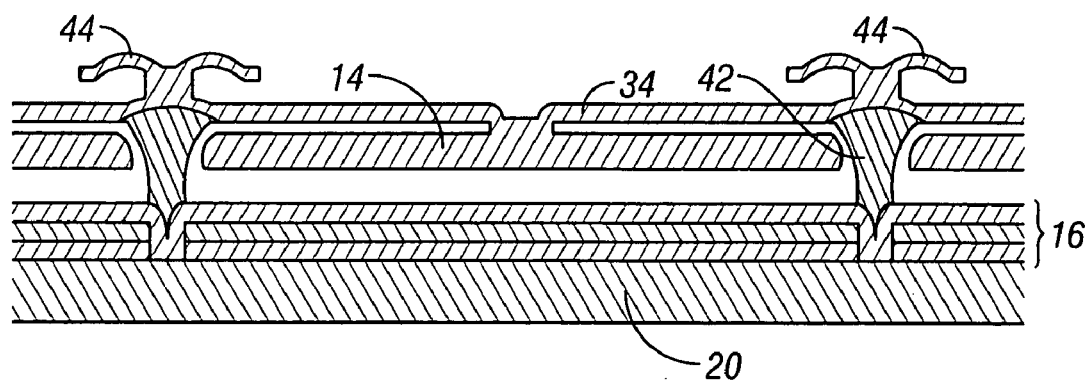
FIG. 7E is a cross section of an additional alternative embodiment of an interferometric modulator.

In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Layers, materials, and/or other structural elements may be described herein as being "over," "above," "between," etc. in relation to other structural elements. As used herein, these terms can mean directly or indirectly on, over, above, between, etc., as a variety of intermediate layers, material, and/or other structural elements can be interposed between structural elements described herein. Similarly, structural elements described herein, such as substrates or layers, can comprise a single component (e.g., a monolayer) or a multi-component structure (e.g., a laminate comprising multiple layers of the recited material, with or without layers of additional materials). Use of the term "one or more" with respect to an object or element does not, in any way, indicate the absence of a potential plural arrangement of objects or elements for which the term is not used. The term "microelectromechanical device," as used herein, refers generally to any such device at any stage of manufacture.

FIGS. 8A-8C and 8E-8H are cross-sectional views, illustrating an exemplary method of forming an interferometric modulator having support structures that are protected from subsequent processing. For example, a protective liner can protect the support structures from a "release" etch that forms the MEMS cavity. In this instance, the support structures can be formed from the same sacrificial material that fills the cavity prior to the release etch.

Figure 8A:
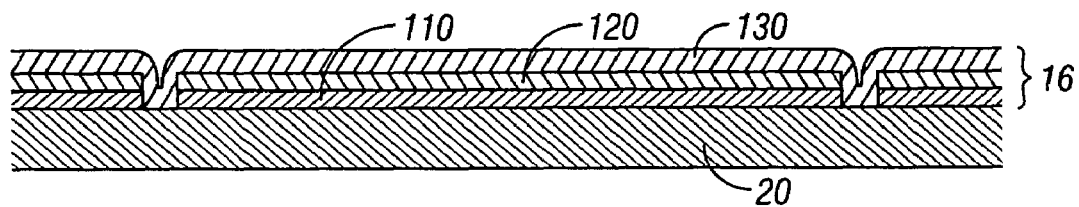
FIGS. 8A-8C and 8E-8H are cross sections illustrating a sequence of an interferometric modulator having support structures formed of sacrificial material, in accordance with an embodiment.

According to this embodiment, an optical stack 16, such as the ones shown in FIGS. 7A-7E, is formed on a transparent substrate 20. As discussed above, the optical stack 16 typically comprises several integrated or fused layers, including a first electrode layer 110, such as ITO, a partially reflective layer 120, such as chromium, and a dielectric layer 130. The layers of the optical stack 16 are preferably patterned into parallel strips to form row electrodes. Typically, as shown in FIG. 8A, the layers of the optical stack 16 are deposited onto a transparent substrate 20, preferably deposited by conventional deposition techniques, such as, for example, some form of sputtering, physical vapor deposition (PVD), chemical vapor deposition (CVD), spin-on dielectric (SOD) and spin-on glass (SOG). The dielectric layer 130 of the optical stack 16 is preferably formed of silicon dioxide ($SiO_2$). In other arrangements, the dielectric layer 130 is formed of other insulating materials and can optionally include one or more etch stop layers to protect the optical stack 16 from subsequent etch steps. As is understood by the skilled artisan, etch stop layers are highly resistant to certain etching techniques to protect the material over which it is formed. Suitable materials for etch stop layers include, for example, $Al_2O_3$, titanium, tungsten, amorphous silicon, germanium, and combinations thereof.

Figure 8B:
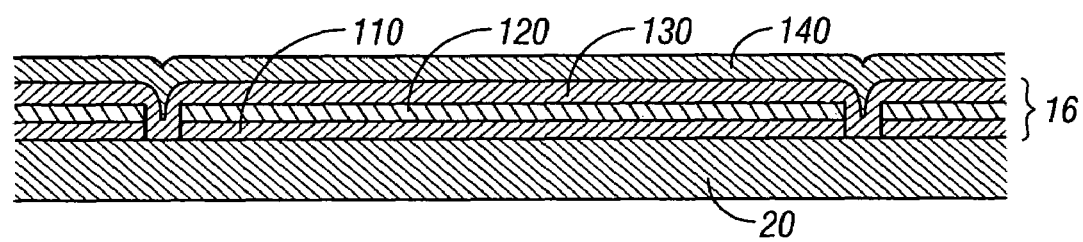

According to this embodiment, formation of the optical stack 16 is followed by deposition of a sacrificial material 140 over the dielectric layer 130, as shown in FIG. 8B. The sacrificial material 140 is preferably deposited (and later selectively removed) over the optical stack 16 to define a resonant optical cavity 180 (FIG. 8H) between the optical stack 16 and the movable layer 170 (FIG. 8H) that will be deposited over the sacrificial material 140. The thickness of the sacrificial material 140 is thus selected for a particular choice of reflected color in the relaxed condition. In other arrangements, multiple thicknesses are deposited to produce multiple different colors, such as red, green, and glue for an RGB display system. In an exemplary embodiment, a modulator having a cavity with the largest height (formed by a sacrificial layer having the greatest thickness) reflects red light, a modulator having a cavity with an intermediate height (formed by a sacrificial layer having an intermediate thickness) reflects green light, and a modulator having a cavity with the smallest height (formed by a sacrificial layer having the smallest thickness) reflects blue light. Though not separately illustrated, the skilled artisan will readily appreciated that the post formation techniques disclosed herein are equally applicable to monochromatic devices and multicolor interferometric modulators with multiple different thicknesses of sacrificial materials.

The sacrificial material 140 preferably comprises an inorganic material. Organic support structures have been provided in interferometric modulator displays because the organic support structure can be made to be very co-planar with the sacrificial layer. However, the skilled artisan will appreciate that, in interferometric modulators, organic support structures can lead to color shift and image retention problems associated with thermal stability and creep. Thus, inorganic support structures that can be made to be co-planar with the sacrificial layer would help to minimize the color shift and image retention problems of the organic support structures. However, the skilled artisan will appreciate that the sacrificial material 140 can comprise an organic material. If the sacrificial material 140 is organic, $O_2$ plasma or down stream $O_2$ can be used to remove the organic sacrificial material 140.

According to one embodiment, the sacrificial material 140 may comprise silicon (Si). In other embodiments, this sacrificial material 140 may be formed of a metal, such as molybdenum (Mo), tungsten (W), titanium (Ti), and tantalum (Ta). In yet another embodiment, the sacrificial material 140 may be formed of silicon-rich silicon nitride. All of these sacrificial materials can be selectively etched by fluorine-based etchants, relative to the exposed dielectric and electrode materials, but the skilled artisan will readily appreciate that other sacrificial materials can be used with other selective etch chemistries. Advantageously, silicon and the metals listed above provide more robust support than photoresist, and are particularly susceptible to selective etching by exposure to $XeF_2$.

Figure 8C:
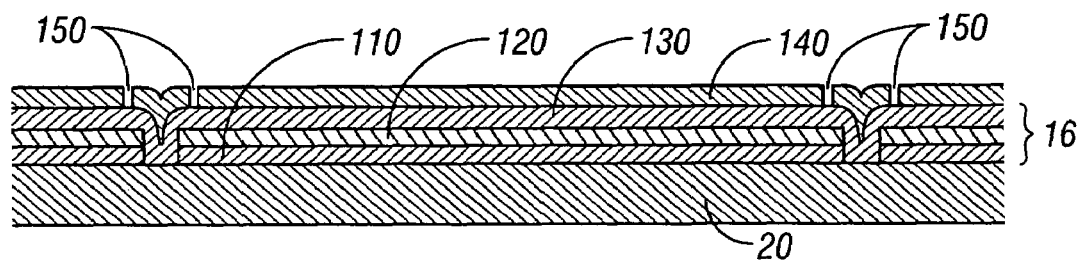
Figure 8D:
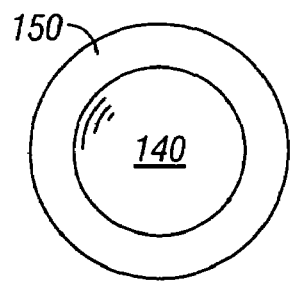
FIG. 8D is a top view of an opening formed at the stage shown in FIG. 8C in the sacrificial material of the embodiment shown in FIGS. 8A-8C and 8E-8H.

As shown in FIG. 8C, in this embodiment, interferometric modulator structure production is continued by patterning and etching openings 150 in the sacrificial material 140. The openings 150 are preferably in the form of annular holes, as shown in FIG. 8D, which is a top view of an opening 150. While the illustrated shape is round, the skilled artisan will understand that the openings may be formed in other enclosed or continuous shapes to surround a portion of the sacrificial material 140 that will form a support structure, including posts and elongated rails, of the device, as will described in more detail below. It will be understood that, as illustrated in FIG. 8C, the widths of the grooves of the openings 150 is much smaller than the diameter or width of the support structure to be formed. However, the skilled artisan will appreciate that for support structures having a smaller diameter or width (e.g., <4-5 microns), the widths of the grooves of the openings 150 will be substantially on the same order as the diameter or width of the support structures.

Figure 8E:
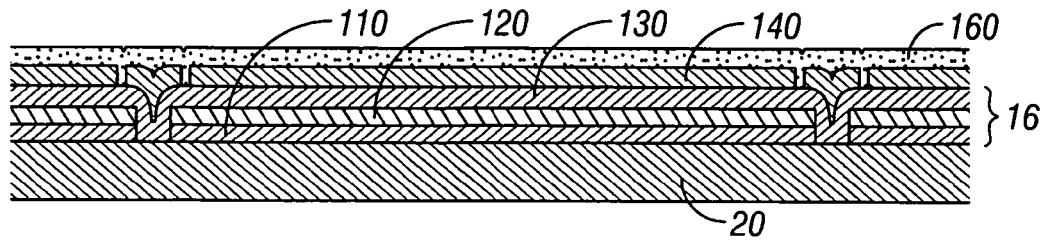

As illustrated in FIG. 8E, a protective material 160 is deposited over the structure to fill the openings 150 with the protective material 160. Suitable materials for the protective material include, but are not limited to, self-planarizing material, such as photoresist, spin-on dielectric (SOD), etc. These materials are self-planarizing as they are deposited by a spin-on deposition process. Moreover, both photoresist materials and silicon oxide based SODs are resistant to fluorine-based etchants. Other suitable materials for the protective material 160 include photo-sensitive polyimide, color pigment for color filter application, BCB (benzocyclobutene, commercially available from Dow Chemical Co. of Midland, Mich.), and spin-on low-k materials. As shown in FIG. 8E, as a result of this deposition, a layer of the protective material 160 is formed over the structure in addition to filling the openings 150. The skilled artisan will appreciate that a protective material 160 formed of a photoreactive polymer, such as photoresist, can be irradiated, rendering the protective material 160 resistant to conditions suitable for etching, ashing, or otherwise removing the sacrificial material 140, which will be described in more detail below.

The protective material 160 and the sacrificial material 140 are preferably selected such that the sacrificial material 140 is selectively and/or preferentially etchable over the protective material 160. Selectivity is such that the protective material 160 will not wear away to expose protected portion (which will form the support structure) of the sacrificial material 140 over the course of a release etch (which depends on the geometry, etchant, materials, etc.). The sacrificial material 140 is selectively or preferentially etchable relative to the protective material 160 if an etchant can etch the sacrificial material 140 at a substantially greater rate than the protective material 160 (e.g., at a rate of greater than about 5×, preferably greater than about 10×, and more preferably greater than about 40× the rate of etching of the protective material 160). The protective material 160 is thus substantially resistant to etching under conditions under which the sacrificial material 140 is substantially susceptible to etching. Those skilled in the art will understand that the selection of the sacrificial material 140 and the protective material 160 will depend on a variety of factors, including the methods and conditions used to deposit the materials (which can affect the physical and/or chemical properties of the materials), and the etching conditions (including the nature of the etching process and the particular etchant used) during removal of the sacrificial material. Those skilled in the art will also understand that all materials are etchable under the appropriate conditions and that the description herein of a material as selectively or preferentially etchable or etch resistant is in comparison with other materials present in the device under the particular conditions to which the materials are exposed. Thus, in many instances, the selection of a sacrificial material that is selectively or preferentially etchable relative to a protective material is determined empirically, under controlled conditions. Alternatively, a wide variety of etching methods, systems, and materials that provide for selective etching of materials of interest are known in the art and/or commercially available.

The skilled artisan will understand that the protective material 160 may be deposited by various methods well known in the art, including, for example, CVD, PVD, and sputtering.

The skilled artisan will appreciate that the thickness of the layer of the protective material 160 (which is selected by the dimensions of the annular opening 150) depends on the thickness of the sacrificial material 140. For example, if the sacrificial material 140 is thicker, then the layer of protective material 160 is preferably also thicker. As mentioned above, the thickness of the sacrificial material 140 will affect the colors produced and that the colors produced also depend on other material properties of the sacrificial material 140. According to a preferred embodiment, the layer of protective material 160 has a thickness that is about ½ to twice the thickness of the sacrificial material 140. The layer of protective material 160 preferably has a thickness (from the top surface of the sacrificial material 140 to the top surface of the protective material 160) in the range of 500 Å to one micron, more preferably in the range of 1000-3000 Å, and even more preferably about 2000Å.

Figure 8F:
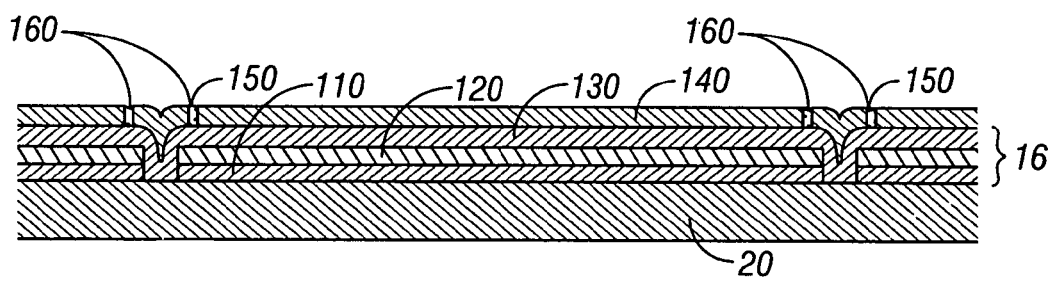
Figure 8G:
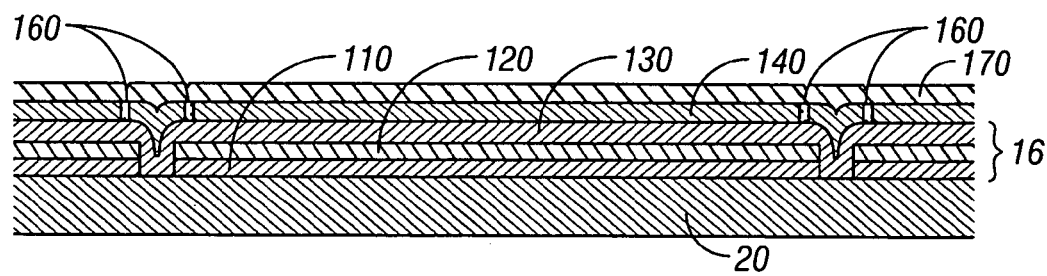
Figure 8H:
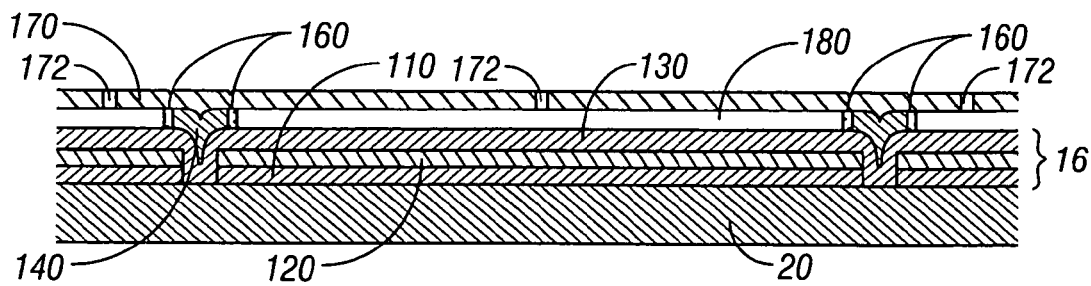

Additional steps according to this method are illustrated in FIGS. 8F-8H. According to this embodiment, the protective material 160 is etched back completely to the top surface of the sacrificial material 140 such that the protective material 160 is left only in the openings 150, as shown in FIG. 8F.

It will be understood that the portions of the sacrificial material 140 that are surrounded by the protective material 160 will serve as support structures or rails of the device. The skilled artisan will appreciate that, preferably, the sacrificial material 140, especially the portions surrounded by the protective material 160, is not harmed when the protective material 160 is etched because the thickness of the sacrificial material 140 determines not only the height of the support structures or posts but also the height of the resonant optical cavity 180 (FIG. 8H) that will be created. A change in the height of the cavity 180 will affect the color(s) reflected by the device.

The skilled artisan will appreciate that, for example, if the protective material 160 comprises photoresist, a selective etch can be used to selectively remove the protective material 160 from the top surface of the sacrificial material 140 without harming the typical sacrificial materials 140 (e.g., silicon, molybdenum). Alternatively, an etch-stop layer can be deposited to protect the sacrificial layer 140. The etch can also be timed to avoid etching the protective material 160 in the openings 150. Optionally, a photoresist mask is preferably used to cover the openings 150 so that the planarization material 160 in the openings 150 is not etched away. For example, a reticle can be used to selectively develop the resist in the openings 150 (or resist outside the openings 150) and then the protective material 160 is selectively removed from the top surface of the sacrificial material 140. Alternatively, an inverse mask pattern to the mask used to define the openings 150 can be formed by using the same reticle with a negative photoresist rather than the positive photoresist used to define the openings 150, or vice versa. An over- or under-exposure ensures full coverage despite small misalignments.

The skilled artisan will appreciate that, alternatively, a backside exposure process may be used with a negative photoresist mask, resulting in the structure shown in FIG. 8F. According to this embodiment, the protective material 160, which is preferably formed of a negative photoresist, in the openings 150 is exposed to light from the backside of the structure through the substrate 20. The light causes the protective material 160 in the openings 150 to harden. The portion of the protective material 160 over the top surface of the sacrificial material is not exposed to the light because the sacrificial material 140 is preferably not transparent, thereby shielding that portion of the protective material 160 from exposure to the light. The unexposed protective material 160 on the top surface of the sacrificial material 140 is then developed for removal, resulting in the structure shown in FIG. 8F. The skilled artisan will appreciate that, in this embodiment, molybdenum is a preferred material for sacrificial material 140 because it is not transparent, whereas silicon is less preferred as a negative photoresist material because it is semi-transparent. Other preferred materials for the sacrificial material 140 include Ti, W, and Ta.

According to one embodiment, the openings 150 have a uniform height to form support structures having a uniform height. In accordance with another embodiment, the openings 150 have varying heights to form support structures having varying heights for a multicolor display. The skilled artisan will understand that the attached Figures are drawn illustrate the sequence of steps described herein and are not drawn to scale.

After the protective material 160 is etched, a movable layer 170 is preferably deposited (and subsequently patterned and etched) over the structure to form the pre-release or unreleased structure illustrated in FIG. 8G. It will be understood that the illustrated embodiment in FIG. 8G shows a movable layer 170 deposited over the structure shown in FIG. 8F. In the illustrated embodiment, the movable layer 170 functions as a movable reflective layer or second electrode as well as a mechanical layer, and thus may be referred to as a mechanical layer, a movable layer, a deformable layer, and/or electrode. The movable layer 170 may comprise a fully reflective, flexible metal, as shown in FIGS. 7A, 7B, and 8H, or it may support a separate mirror, as shown in FIGS. 7C-7E. Other suitable materials for the movable layer 170 include, but are not limited to, aluminum, aluminum alloys, chromium, and nickel. In other embodiments, the movable layer 170 may comprise multiple layers, such as $Al/SiO_2$, $Ni/Al/AlO_x$, and $Ni/Al/SiO_2$. It will be understood that, in the multi-layer embodiments, the movable layer 170 has a reflective layer having a backside comprised of a material resistant to the etchant. The movable layer 170 preferably connects, either directly or indirectly, to the substrate 20 around the perimeter of the movable layer 170.

After the movable layer 170 is deposited and other steps to complete the device (e.g., patterning columns to cross with rows), the sacrificial material 140 is selectively removed. The skilled artisan will appreciate that the movable layer 170 may also be etched with openings or holes 172 so that the etch gas used for sacrificial layer removal can reach the sacrificial material 140. The skilled artisan will understand that the openings 172 can be etched by masking the movable layer 170 with a mask (not shown) formed of, for example, photoresist, and etching through the mask. The mask is removed after the openings 172 are etched. It will be understood that, as part of the overall packaging process, the interferometric modulators are subsequently sealed and protected from the environment surrounding the package containing the interferometric modulators. Preferably, such holes or openings have a diameter as small as the photolithographic system will permit. In an embodiment, holes or openings have a diameter in the range of about 2-6 microns. It will be understood that a stepper tool may be used to form openings that are smaller, less than one micron, and more preferably less than 0.5 micron. The skilled artisan will understand that the size, spacing, and number of openings will affect the rate of removal of the sacrificial material 140.

As shown in FIG. 8H, the sacrificial material 140 is removed between the supports 18 surrounded by the "covers"

formed of the protective material 160, preferably using a selective gas etching process (e.g., selective to the mirror or movable layer 170, dielectric 130, and protective material 160), to create the optical cavity 180 between the movable layer 170 and the dielectric layer 130 of the optical stack 16. After selective etching of the sacrificial material 140, the movable layer 170 is supported by and rests on the supports 18 formed by the sacrificial material 140.

Various etching processes (including wet methods and dry methods) and etchants may be used to remove the sacrificial material 140. Standard etching techniques well known in the art may be used to remove the sacrificial material 140. Suitable etching techniques include, for example, wet etching methods and dry etching methods. The particular etching process will depend on the material to be removed.

Chemical dry etching methods typically involve exposure of gaseous, chemically reactive etchants to the sacrificial material 140, converting the material into volatile products that are removed, for example, by a vacuum source. Examples of etchants useful in dry etching methods include mixtures of one or more gases, for example mixtures of an inert gas (e.g., Xe or Ar) with, for example, $N_2$, $F_2$, $H_2$, CO, $Cl_2$, $N_xF_y$ (e.g., $NF_3$), $C_xF_y$ (e.g., $C_2F_6$), and/or $Si_xF_y$ (e.g., $SiF_4$). For example, xenon difluoride ($XeF_2$) produce a dry etchant release gas for selectively removing a silicon, molybdenum, titanium, or tungsten sacrificial layer relative to protective materials 160, including, but not limited to, silicon oxide, silicon nitride, alumina, photoresist, and aluminum, as $XeF_2$ does not appreciably etch these materials. It will be understood that this etching process is a selective etching process that does not etch the dielectric, semi-reflecting, or electrode materials, such as the illustrated movable layer 170, protective material 160, and the lower dielectric layer 130, or any etch-stop materials over these structures.

An exemplary wet etchant is a phosphoric/acetic/nitric acid or "PAN" etchant, which can selectively remove, for example, Mo, Al, or Ge relative to various materials, including, but not limited to, silicon oxide, silicon nitride, titanium, nickel, chromium, ITO, silicon carbide, and amorphous silicon. The skilled artisan will appreciate that a sacrificial material 140 comprising tantalum and titanium, for example, may be removed by either wet or dry etch chemistries, including, but not limited to, etching by etchants, such as $XeF_2$, fluorine plasma ($CF_4$, $NF_3$, $SF_6$), and $Cl_2$. A sacrificial material 140 comprising magnesium is preferably removed using a wet etch chemistry, including, but not limited to, etching by etchants, such as HCl and $HNO_3$.

A sacrificial material 140 comprising aluminum is preferably removed using a wet etch chemistry rather than a dry etch chemistry. Suitable wet etchants for an aluminum sacrificial material 140 include, but are not limited to, bases such as ammonium hydroxide ($NH_4OH$) and TMAH organic base, phosphoric acid, HCl, PAN etchant, NaOH, and KOH. Although a wet etchant is preferred for removal of aluminum, a dry etchant, such as $Cl_2$ plasma, can be used to remove aluminum. The skilled artisan will appreciate that wet etchants used to etch an aluminum sacrificial material may also remove aluminum, if any, on the backside of the movable layer 170 and that any such aluminum on the backside of the movable layer 170 should be protected from the etching with a thin (e.g., <100 Å) dielectric layer. The skilled artisan will appreciate that, for embodiments in which the movable layer 170 has aluminum on the backside, nickel (or any metal that is resistant to the etchant) can be used as the reflective material on the backside of the movable layer 170, as nickel is resistant to etchants for aluminum.

In some embodiments, the etching is monitored, for example, by monitoring the reflectivity of the device, or the etching products released. In other embodiments, the etching is conducted for a predetermined period of time. Those skilled in the art will understand that the etching rate of a layer depends on the thickness of the layer. In general, a thicker layer will etch more slowly than a thinner layer. As described above, the movable layer 170 may also be patterned to provide openings or holes 172 so that the etch gas used for sacrificial layer removal can reach the sacrificial material 140. The skilled artisan will understand that the etching rate also depends on the number of the openings 172 and the size of the openings 172.

In accordance with this embodiment, the resulting final structure of the interferometric modulator is shown in FIG. 8H. As shown in FIG. 8H, the movable layer 170 on the top surface and the protective material 160 on the side walls together encapsulate the sacrificial material 140 to protect it from the release etch that creates the optical cavity 180. In a particularly preferred embodiment, the sacrificial material 140 comprises molybdenum and the final resulting structure of the interferometric modulator has supports 18 having straight side walls. In this embodiment, the protective material 160 may comprise photoresist or SOD.

Figure 9:
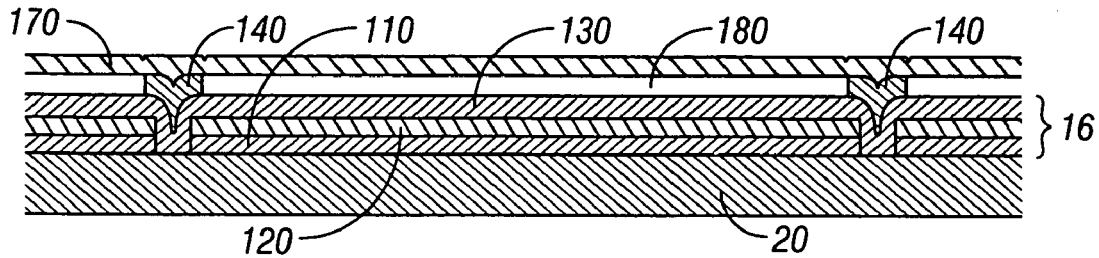
FIG. 9 is a cross section of an interferometric modulator formed in accordance with another embodiment.

FIG. 9 illustrates the resulting final structure of an interferometric modulator fabricated in accordance with an alternative embodiment. In accordance with this embodiment, after the sacrificial material 140 is selectively removed from the structure shown in FIG. 8G, the protective material 160 in the openings 150 surrounding the supports are also removed. The selective removal may be performed by any type of selective etching process (wet or dry) so long as there is no $SiO_2$ exposed to the etchant. For example, the skilled artisan will appreciate that an $Al_2O_3$ etch stop over the optical stack 16 could be used or alternative dielectrics for the optical stack 16. Alternatively, an ashing process may be used to remove the remaining protective material 160 in the openings 150. The skilled artisan will readily appreciate that the ashing process is used to remove protective material 160 comprising photoresist.

Figure 10A:
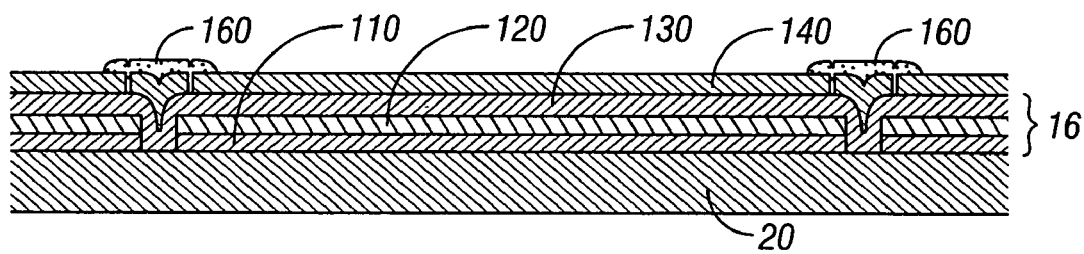
FIGS. 10A, 10C, and 10D are cross sections illustrating a sequence of forming an interferometric modulator formed in accordance with another embodiment.
Figure 10B:
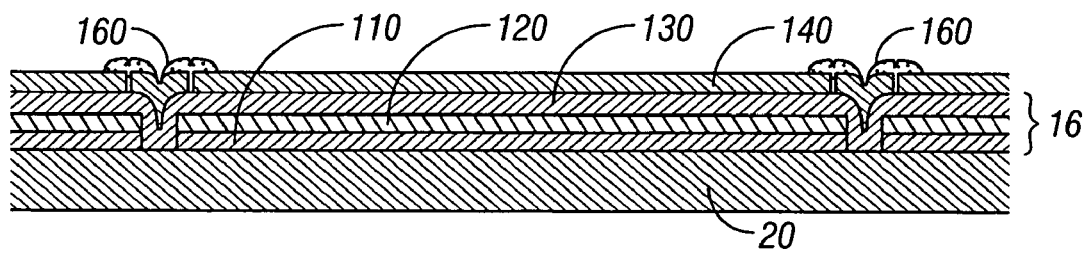
FIG. 10B is a cross section of an interferometric modulator formed in accordance with yet another embodiment.
Figure 10C:
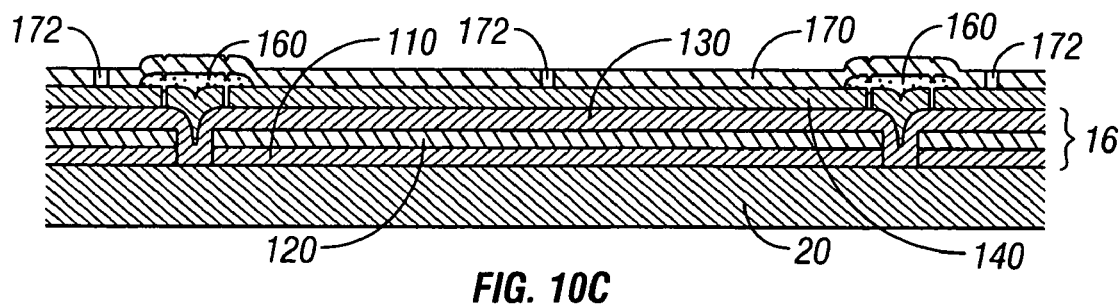
Figure 10D:
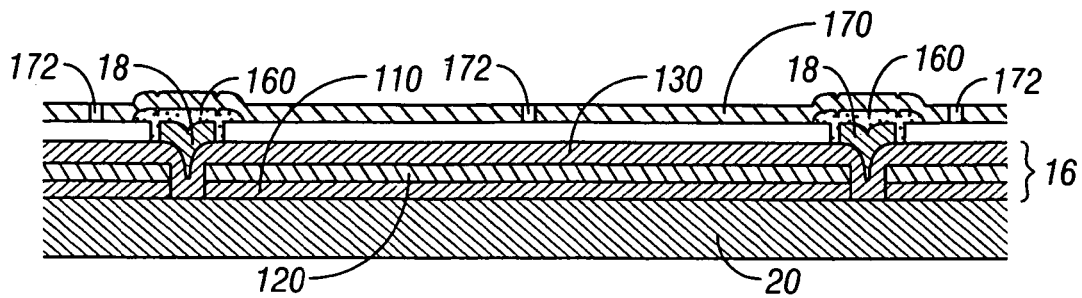

According to another embodiment, after the protective material 160 is deposited, as illustrated in FIG. 8E, the protective material 160 is then etched back to the top surface of the sacrificial material 140 to form a "cover" over certain portions of the sacrificial material 140, as shown in FIG. 10A. Preferably, the protective material 160 is etched after masking with a photolithographic process. These portions of the sacrificial material 160 under the "cover" will serve as supports 18 (FIG. 10D) in this embodiment. Preferably, the protective material 160 is etched back leaving a "cover" slightly wider than the support area to ensure covering the support area in case of mask misalignment, as illustrated in the embodiment shown in FIG. 10A. Alternatively, as shown in FIG. 10B, the "cover" is formed as an annulus only over the protective material 160 in the openings 150. As illustrated by the unreleased structure shown in FIG. 10C, the movable layer 170 is deposited over the structure after the protective material 160 is etched to form the "cover." Although FIG. 10C illustrates the movable layer 170 as deposited over the structure shown in FIG. 10A, the skilled artisan will understand that, in an alternative embodiment, the movable layer 170 may be deposited over the structure shown in FIG. 10B. The skilled artisan will understand that subsequent steps of patterning, selective removal, etc., as described above, follow deposition of the movable layer 170 to complete the device, resulting in the final structure of this embodiment, schematically shown in FIG. 10D.

Alternatively, in an embodiment where the protective material 160 is photoresist, after selective removal of the sacrificial material 140 shown in FIG. 10A, an ashing process may be used to remove the remaining protective material 160 in the openings 150, leaving protective material 160 only on the top surface of the sacrificial material 140 in the area for forming the support structure. The skilled artisan will understand that an ashing process may be used to remove the remaining protective material 160 in the structure shown in FIG. 10B after selective etching of the sacrificial material 140.

Figure 11A:
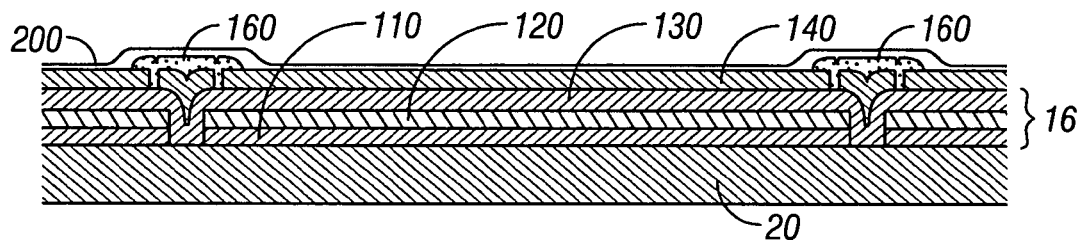
FIGS. 11A-11C are cross sections of an interferometric modulator formed in accordance with another embodiment.
Figure 11B:
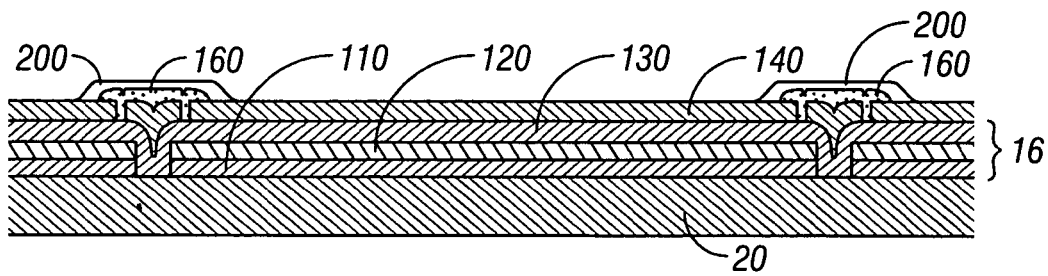
Figure 11C:
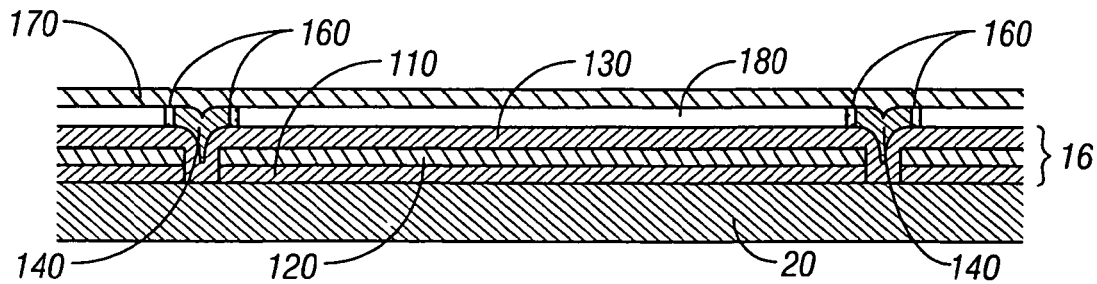

According to one embodiment, a layer of photoresist 200 may be spun over the structures shown in FIGS. 10A and 10B prior to deposition of the movable layer 170, as illustrated in FIG. 11A. The removal of the protective material 160, along with this additional layer of photoresist 200, from the top surface of the sacrificial layer 140 results in a device having an even more planarized movable layer 170. This layer of photoresist 200 has a thickness that is preferably on the same order as the thickness of the protective material 160. Thus, the skilled artisan will understand that, for example, if the protective material has a thickness of about 1000 Å, the thickness of the photoresist layer 200 is preferably in the range of about 500-2000 Å. According to this embodiment, the photoresist layer 200 is then patterned and etched so that it covers only the protective material 160, as shown in FIG. 11B. The photoresist layer 200 and protective material 160 are then both removed, preferably by plasma-etching, to yield the structure shown in FIG. 11C. The photoresist layer 200 helps minimize dishing of the top surface of the protective material 160 within the openings 150 when the protective material 160 is removed. As shown in FIG. 11C, the movable layer 170 has a top surface that is only slightly dished in portions over the openings 150 filled with protective material 160. According to this embodiment, the movable layer 170 is even more planarized than the movable layer 170 in the embodiment shown in FIGS. 8H and 10D.

In another embodiment, to form a support structure, a self-planarizing material, such as photoresist, can be used to isolate a portion of sacrificial material until after selective removal of the sacrificial material is performed. FIGS. 12A-12I depict a process for forming a device comprising such a support structure. As noted above, the skilled artisan will understand that the attached Figures are drawn illustrate the sequence of steps described herein and are not drawn to scale.

Figure 12A:
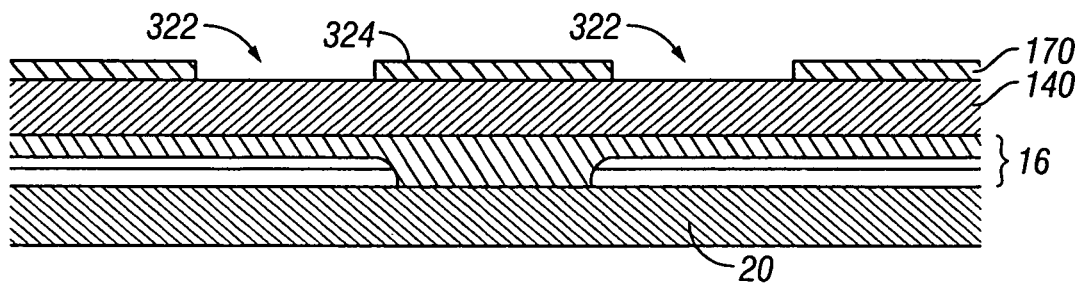
FIGS. 12A, 12C, and 12E-12H are cross-sections illustrating certain steps in the fabrication of an interferometric modulator in accordance with yet another embodiment.
Figure 12B:
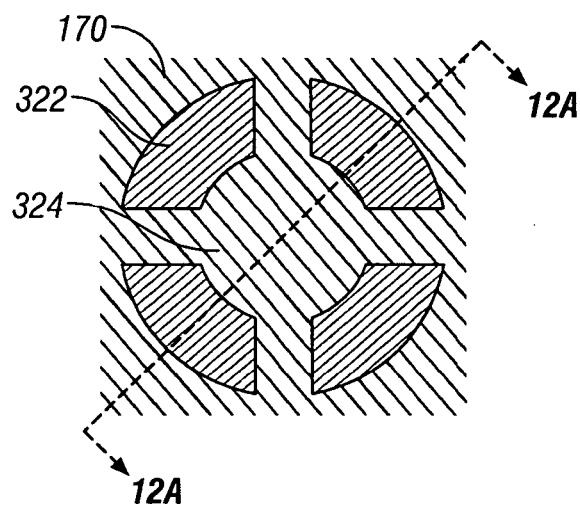
FIGS. 12B, 12D, and 12I are top views illustrating the interferometric modulator at certain stages in the fabrication process of FIGS. 12A, 12C and 12E-12H.

In FIG. 12A, it can be seen that a sacrificial material 140 has been deposited over an optical stack 16, and a mechanical layer, which in this embodiment is a movable reflective layer 170, has been formed over the sacrificial material 140. The sacrificial material 140 is deposited to a thickness preferably in the range of about 1000-4000 Å. As shown in FIG. 12A, apertures 322 are etched in the movable reflective layer 170, surrounding a portion 324 of the movable reflective layer 170. This portion 324 of the movable layer 170 is positioned over the area of the sacrificial material 140 that will form the support structures. FIG. 12B is a top view of the partially fabricated device at the stage of FIG. 12A. (FIG. 12A is a cross-section of the device taken along line 12A-12A) As can be seen in FIG. 12B, the apertures 322 do not completely isolate the portion 324 of the movable reflective layer 170 from the rest of the layer 170.

Figure 12C:
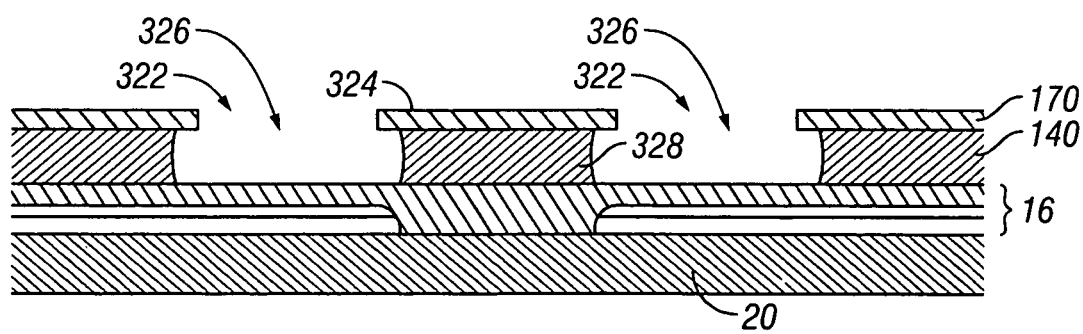
Figure 12D:
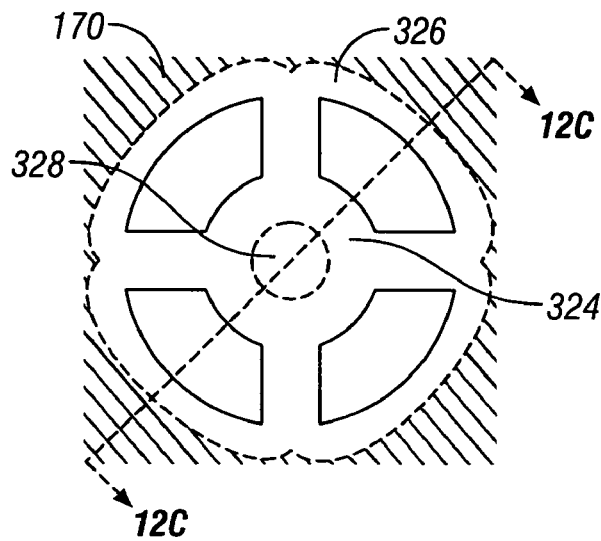

In FIG. 12C, it can be seen that the sacrificial material 140 immediately underneath the apertures 322 has been etched to form a cavity 326 surrounding a residual column 328 of sacrificial material 140. A timed etch process is preferably used to etch the sacrificial material 140. The etch process which forms the cavity 326 may also partially undercut the movable reflective layer 170. The shape of the cavity 326 can be more clearly seen in FIG. 12D, which is a top view of the partially fabricated device at the stage of FIG. 12C. The edge of the remaining sacrificial material is indicated by a dashed line. As can be seen, the cavity 326 is an annular cavity surrounding a column 328 of sacrificial material.

Figure 12E:
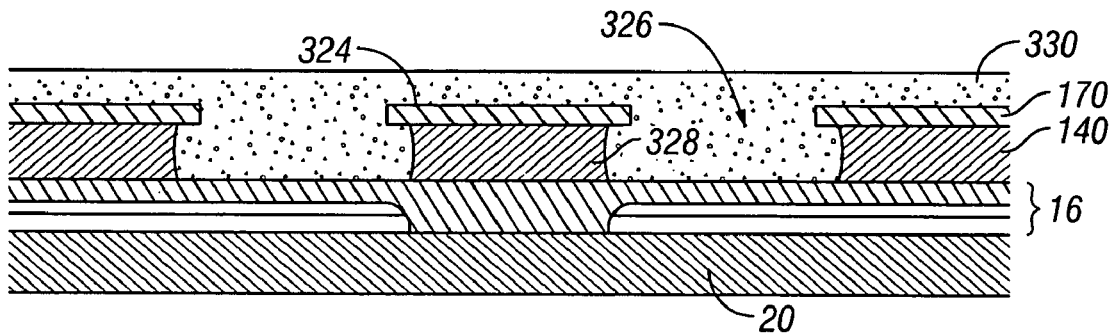
Figure 12F:
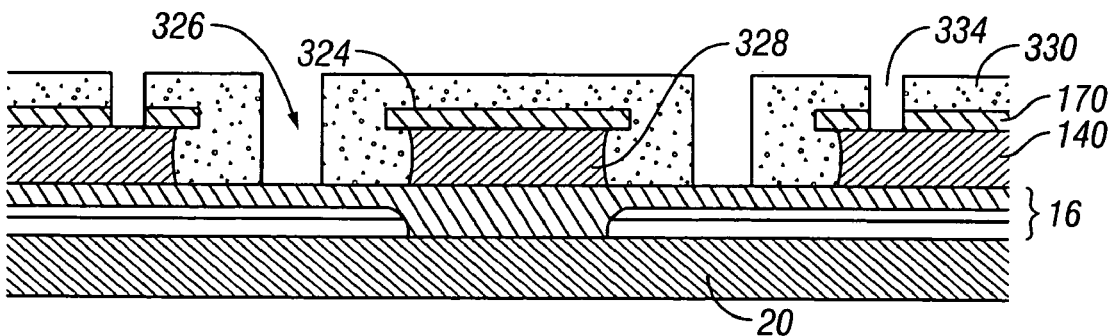

In FIG. 12E, it can be seen that a layer of self-planarizing material 330 has been deposited, filling the cavity 326 and extending over the movable reflective layer 170. In an embodiment, the planarizing material 330 may comprise a photoresist. The thickness of the planarization material 330, from the top surface of the movable layer 170 to the top surface of the planarization material 330, is preferably in the range of about 3000 Å to five microns, and more preferably about one micron. In FIG. 12F, the planarizing material 330 has been patterned and etched, and the underlying movable reflective layer 170 has been patterned and etched, forming etch holes 334, which extend through the planarization layer 330 and the movable layer 170 to the sacrificial material 140. It will be understood that the etch holes 334 are provided for selective removal of the sacrificial material 140. In an embodiment in which the planarization layer 330 comprises a photoresist, no etching of the planarization material 330 may be necessary. In the illustrated embodiment, the planarization material 330 within the cavity 326 has also been etched, although the column 328 remains insulated by the planarization material 330, as shown in FIG. 12F. Advantageously, this patterning will facilitate the later removal of the planarization material 330, such as by resist ashing.

Figure 12G:
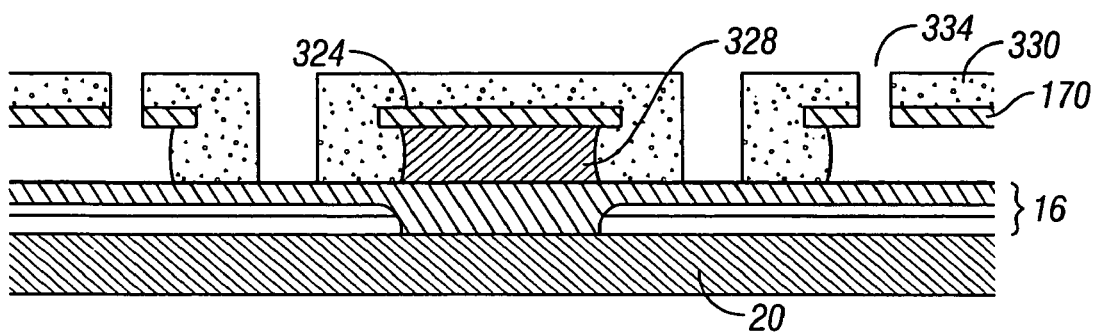
Figure 12H:
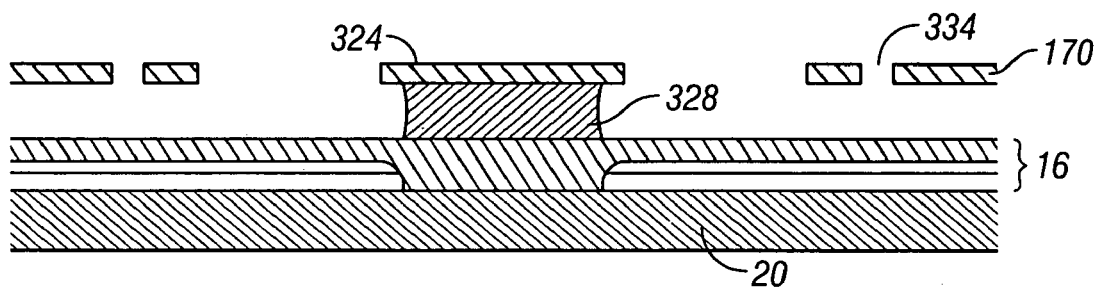
Figure 12I:
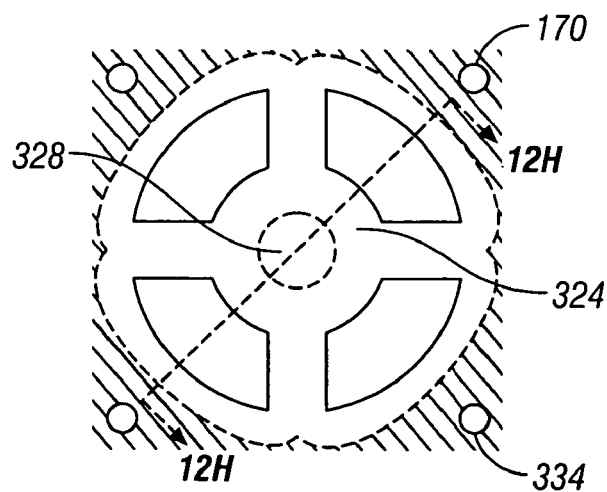

In FIG. 12G, an etching process is performed to selectively remove the sacrificial material 140 via the etch holes 334. As can be seen, the column 328 of sacrificial material remains, as it is protected from the etch by the planarization material 330. In FIG. 12H, the planarization material is removed, such as by an ashing process, leaving a column 328 of sacrificial material which serves as a support structure. FIG. 12I is a top view of the device of FIG. 12H, in which it can be seen that the column 328 underlies the portion 324 of the movable reflective layer 170, providing support for the entire layer.

As the movable mechanical layer 170 was deposited on a planar sacrificial layer, it can be seen that the movable layer 170 advantageously remains substantially flat. This substantial flatness minimizes the likelihood that residual stresses within the layer 170 will pull it upwards or downwards from the flat position, and also minimizes the likelihood that any residual stresses will encourage delamination, pulling away from the column 328, which serves as a support structure. Thus, the flat nature of the deposited movable layer 170 both minimizes the effect of the residual stresses and the magnitude of the residual stresses themselves. Furthermore, because the column can be made substantially cylindrical, the actuation of the movable layer to a collapsed position against the optical stack 16 is less likely to result in mechanical failure near the edges of the support structure, as might occur over time in a support structure having unsupported wings.

Those skilled in the art will understand that changes in the device and manufacturing techniques described above are possible. For example, component and/or steps may be added and/or removed, and the sequence of steps may also be altered. Moreover, the methods, structures, and systems described herein are useful for fabricating other electronic devices, including other types of MEMS devices and other types of optical modulators.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

We claim:

1. A microelectromechanical systems device comprising:
   a substrate having a first electrode layer formed thereon;
   a second electrode layer spaced apart from the first electrode layer by a cavity;
   at least one support structure comprising side surfaces surrounding the support structure;
   a protective material surrounding the at least one support structure to laterally isolate the at least one support structure from the cavity, the protective material covering all of the side surfaces and preventing exposure of the side surfaces to the cavity;
   a first layer formed over the substrate; and
   a second layer formed over the first layer,
   wherein the at least one support structure is interposed between the first and second layers,
   wherein the protective material, the first layer, and the second layer together encapsulate the at least one support structure, and
   wherein the at least one support structure is configured to support the second electrode layer.

2. The microelectromechanical systems device of claim 1, wherein the at least one support structure is formed over the first electrode layer and the protective material is a self-planarizing material.

3. The microelectromechanical systems device of claim 2, wherein the protective material comprises photoresist.

4. The microelectromechanical systems device of claim 2, wherein the protective material comprises spin-on dielectric.

5. The microelectromechanical systems device of claim 1, wherein the second electrode layer is configured to be movable.

6. The microelectromechanical systems device of claim 1, wherein the protective material has a thickness in a range of about 500 Å to one micron.

7. The microelectromechanical systems device of claim 1, wherein the at least one support structure comprises an inorganic material.

8. The microelectromechanical systems device of claim 1, wherein the at least one support structure comprises molybdenum having straight side surfaces.

9. The microelectromechanical systems device of claim 8, wherein the first layer is a dielectric layer over the first electrode layer, the first layer having a dielectric top surface exposed to the cavity.

10. The microelectromechanical systems device of claim 9, wherein the dielectric top surface comprises silicon dioxide.

11. The microelectromechanical systems device of claim 9, wherein the dielectric top surface comprises $Al_2O_3$.

12. The microelectromechanical systems device of claim 9, wherein the second layer is the second electrode layer, the second layer comprising an aluminum surface exposed to the cavity.

13. The microelectromechanical systems device of claim 1, wherein the at least one support structure is selectively etchable with respect to the protective material.

14. The microelectromechanical systems device of claim 13, wherein the at least one support structure is etchable by xenon difluoride.

15. The microelectromechanical systems device of claim 1, further comprising:
   a display;
   a processor that is in electrical communication with said display, said processor being configured to process image data;
   a memory device in electrical communication with said processor.

16. The microelectromechanical systems device of claim 15, further comprising: a driver circuit configured to send at least one signal to said display.

17. The microelectromechanical systems device of claim 16, further comprising: a controller configured to send at least a portion of said image data to said driver circuit.

18. The microelectromechanical systems device of claim 15, further comprising: an image source module configured to send said image data to said processor.

19. The microelectromechanical systems device of claim 18, wherein said image source module comprises at least one of a receiver, transceiver, and transmitter.

20. The microelectromechanical systems device of claim 15, further comprising: an input device configured to receive input data and to communicate said input data to said processor.

21. A method of making an interferometric modulator device, comprising:
   providing a substrate having a first electrode layer formed over the substrate;
   depositing a sacrificial material over the first electrode layer;
   surrounding at least one support structure comprising side surfaces with a protective material after depositing the sacrificial material such that all of the side surfaces are covered and surrounded by the protective material; and
   creating a cavity between the first electrode layer and a movable layer after surrounding the at least one support structure, wherein the protective material laterally isolates the at least one support structure from the cavity,
   wherein surrounding the at least one support structure comprises:
      etching at least one annular opening in the sacrificial material after depositing the sacrificial material; and
      filling the at least one annular opening with the protective material to surround the at least one support structure.

22. The method of claim 21, further comprising forming the movable layer after surrounding the at least one support structure, wherein creating the cavity comprises selectively removing the sacrificial material outside of the protective material after forming the movable layer.

23. The method of claim 22, wherein forming the movable layer completes encapsulation of the at least one support structure.

24. The method of claim 22, wherein the sacrificial material comprises a material selected from the group consisting of silicon, molybdenum, tungsten, titanium, and photoresist.

25. The method of claim 22, further comprising removing the protective material after selectively removing the sacrificial material outside of the protective material.

26. The method of claim 25, wherein the protective material is removed by ashing.

27. The method of claim 22, wherein providing the substrate comprises depositing a dielectric material over the first electrode layer before depositing the sacrificial material.

28. The method of claim 22, further comprising forming openings in the movable layer prior to selectively removing the sacrificial material.

29. The method of claim 22, wherein the at least one support structure is formed from the sacrificial material.

30. The method of claim 22, wherein the support structure is formed of a material susceptible to selective removing of the sacrificial material.

31. The method of claim 22, wherein the support structure and selectively removed portions of the sacrificial material are susceptible to removal by a same etchant.

32. The method of claim 31, wherein the etchant is xenon difluoride.

33. The method of claim 22, wherein the protective material has a thickness in a range of ½ to twice a thickness of the sacrificial material.

34. The method of claim 22, wherein selectively removing comprises etching using xenon difluoride.

35. The method of claim 21, further comprising forming the movable layer over the sacrificial material before surrounding the at least one support structure, wherein creating the cavity comprises selectively removing the sacrificial material outside of the protective material.

36. The method of claim 35, further comprising etching the movable layer after depositing the sacrificial material.

37. The method of claim 36, wherein etching the at least one annular opening comprises etching the at least one annular opening after etching the movable layer, wherein etching the at least one annular opening comprises using a timed etch process.

38. The method of claim 36, wherein etching the movable layer comprises etching a plurality of apertures in the movable layer and etching the sacrificial material comprises removing the sacrificial material under the plurality of apertures.

39. The method of claim 36, wherein surrounding the at least one support structure comprises:
   depositing a planarization material over the movable layer and into cavity after etching the movable layer and the sacrificial layer; and
   etching the planarization material to surround the at least one support structure.

40. The method of claim 39, further comprising removing the planarization material after creating the cavity.

41. The method of claim 22, further comprising:
   forming a first layer over the substrate; and
   forming a second layer over the first layer such that the at least one support structure is interposed between the first and second layers,
   wherein the protective material, the first layer, and the second layer together encapsulate the at least one support structure such that the at least one support structure is protected when selectively removing the sacrificial material.

* * * * *